United States Patent [19]
Schrodi

[11] Patent Number: 5,091,903
[45] Date of Patent: Feb. 25, 1992

[54] SWITCHING NETWORK AND SWITCHING-NETWORK MODULE FOR AN ATM SYSTEM

[75] Inventor: Karl Schrodi, Heimsheim, Fed. Rep. of Germany

[73] Assignee: Alcatel N.V., Amsterdam, Netherlands

[21] Appl. No.: 566,158

[22] Filed: Aug. 9, 1990

[30] Foreign Application Priority Data

Aug. 9, 1989 [DE] Fed. Rep. of Germany ....... 3926301
Jun. 29, 1990 [DE] Fed. Rep. of Germany ....... 4020775

[51] Int. Cl.[5] .......................................... H04Q 11/04
[52] U.S. Cl. ............................... 370/58.1; 340/825.8
[58] Field of Search ................ 370/58.1, 63, 16, 59; 340/825.8

[56] References Cited

U.S. PATENT DOCUMENTS

| | | | |
|---|---|---|---|
| 4,382,294 | 5/1983 | Buescher et al. | 370/63 |
| 4,473,900 | 9/1984 | Belforte et al. | 370/58.1 |
| 4,654,842 | 3/1987 | Coraluppi et al. | 370/58.1 |
| 4,718,058 | 1/1988 | van Vugt | 370/63 |
| 4,811,333 | 3/1989 | Rees | 370/58.1 |

OTHER PUBLICATIONS

J. S. Turner, "Design of a Broadcast Packet Network", *Proceedings of INFOCOM* 86, Apr. 1986, pp. 667–675.
J. M. Cotton et al, "ITT 1240 Digital Exchange Digital Switching Network", *Electrical Communication*, vol. 56, No. 2/3, 1981, pp. 148–160.

*Primary Examiner*—Douglas W. Olms
*Assistant Examiner*—Dang Ton
*Attorney, Agent, or Firm*—Christie, Parker & Hale

[57] ABSTRACT

The disclosed asynchronous transfer mode (ATM) switching network evenly scatters individual cells of an ATM data stream in the first half of the network and routes them to their intended destination in the second half of the network. The network is constructed from interchangeable switching modules each preferably containing only two stages of switching elements, with each switching element having a common memory, thus reducing the component count by one third compared to Clos' 3-stage non-blocking modules. Each individual module provides a switched path from any selected one of its module inputs to any selected one of its module outputs, with the common memory acting as a buffer until a path becomes available to the desired module output. Since the additional stages between the module's input stage and the module's output stage typically used to provide a non-blocking module are dispensed with, not only the component count, but also the transmission delay through the switching network may be reduced.

6 Claims, 13 Drawing Sheets

SWITCHING NETWORK AND SWITCHING-NETWORK MODULE FOR AN ATM SYSTEM

TECHNICAL FIELD

The present invention relates to a switching network for an ATM system and to a switching-network module for such a system.

CLAIM FOR PRIORITY

This application is based on and claims priority from applications first filed in Fed. Rep. Germany on 9 Aug 1989 and 29 June 1990 under serial numbers 39 16 301 and 40 20 775. To the extent such prior applications may contain any additional information that might be of any assistance in the use and understanding of the invention claimed herein, they are hereby incorporated by reference.

BACKGROUND ART

A typical prior art ATM a switching network is known from J. S. Turner, "Design of a Broadcast Packet Network", published in "Proceedings of INFOCOM '86", April 1986, pages 667 to 675.

The term "ATM system" (ATM=Asynchronous Transfer Mode) as used herein means any information transmission system in which the information is split into parts of equal or unequal length and transmitted, together with a connection-specific header, as a sequence of packets or cells.

The above-referenced switching network is a switching network with multiple paths. It is constructed exclusively from 2×2 switching elements. Generally, however, switching elements are needed which can arbitrarily connect as large a number of inputs to as large a number of outputs as possible. In this manner, only few stages have to succeed one another, so that delays, delay jitter, and cell losses are kept to a minimum. However, such switching elements should be combined in integrated circuits, in which at least the number of leads cannot be enlarged without difficulty. In ATM systems, because of the high transmission rate, which is expected to be about 150 Mb/s or even 600 Mb/s, parallel data transfer will frequently be necessary.

It is also known to replace larger switching elements by switching-network modules which are constructed from several switching elements and act outwardly like one large switching element. Such a switching-network module should be nonblocking.

DISCLOSURE OF INVENTION

The invention takes advantage of the peculiarities of the switching network and the mode of operation used. In the switching network and the mode of operation used here, wherein the traffic is evenly distributed over the whole switching network down to the smallest unit, namely a cell, only local, short-time blocking can occur, which can be handled by buffers. This load distribution can be further refined by dividing the cells within the exchange into two or more smaller cells each having a cell header of its own. The additional cell headers increase the total load, however.

Thanks to the very uniform load distribution, multiple-path capability can be dispensed with not only within each of the two portions of the switching network, but also within individual switching-network modules. It suffices if, within a switching-network module, one path is possible from every input to every output. If the capacities of the individual paths are equal, it suffices if the sum of the capacities of all paths is sufficient for carrying the total traffic.

For a given size of the individual switching-network modules, the number of successive stages must be chosen so that, as required, one path is possible from every input to every output. It turns out that the minimum number of successive stages is also optimal inasmuch as every additional stage not only requires additional circuitry but also results in additional delays, additional delay jitter, and additional cell losses. Additional paths, which are possible for a given size of the switching elements without an increase in the number of stages, have no adverse effect. They may even be necessary to make available the total capacity.

A disadvantage of the above-mentioned mode of operation is that, unlike in a virtual circuit, the cells belonging to the same connection can take different paths and thus may pass each other. A simple way of preventing this has been known for a long time:

If cells belonging together follow each other closely, the next cells are delayed at the input of the exchange until the respective preceding cell can no longer be passed. An input conversion unit suitable for this, even though intended for another purpose, is disclosed in published German patent application P 38 40 688.8.

BRIEF DESCRIPTION OF DRAWINGS

The invention will become more apparent from the following description of an embodiment thereof when taken in conjunction with the accompaning drawings, in which.

BEST MODE FOR CARRYING OUT THE INVENTION

Figure 1:
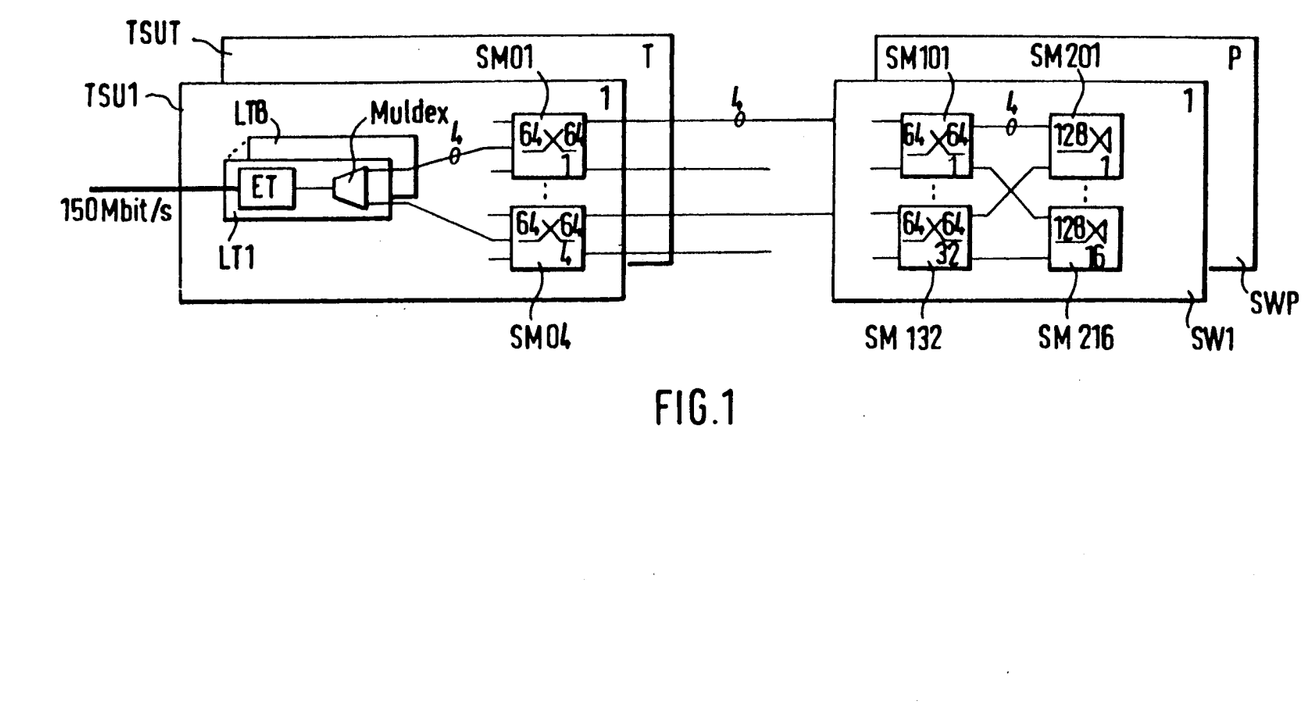
FIG. 1 shows the structure of a switching network in accordance with the invention.

The switching network of FIG. 1 has T terminal units TSU1 . . . TSUT and P switching planes SW1 . . . SWP. In the embodiment shown, T has a maximum value of 128, and P a maximum value of 16. Each terminal unit contains up to 8 line units LT1 . . . LT8 and 4 switching-network modules SM01 . . . SM04. Each switching plane contains two stages of switching-network modules; the first stage contains up to 32 switching-network modules SM101 . . . SM132, and the second stage up to 16 switching-network modules SM201 . . . SM216.

All switching-network modules SM are of identical construction. Each of them has 128 inputs and 128 outputs which act outwardly as a 128×128 matrix. The switching network is designed as a reverse switching arrangement, i.e., the switching-network modules SM0 and SM1 of the two front stages, which also act as the fifth and fourth stages, respectively, are used as two 64×64 matrices.

Each of the line units LT contains a line terminating equipment ET and a multiplexer/demultiplexer Muldex, which distributes the incoming traffic to the switching network modules SM01 ... SM04 of the respective terminal unit TSU and combines the outgoing traffic in the opposite direction. All paths are designed for 150 Mb/s; between the switching-network modules, every four such paths are combined into one 600-Mb/s path by multiplexing.

Figure 2:
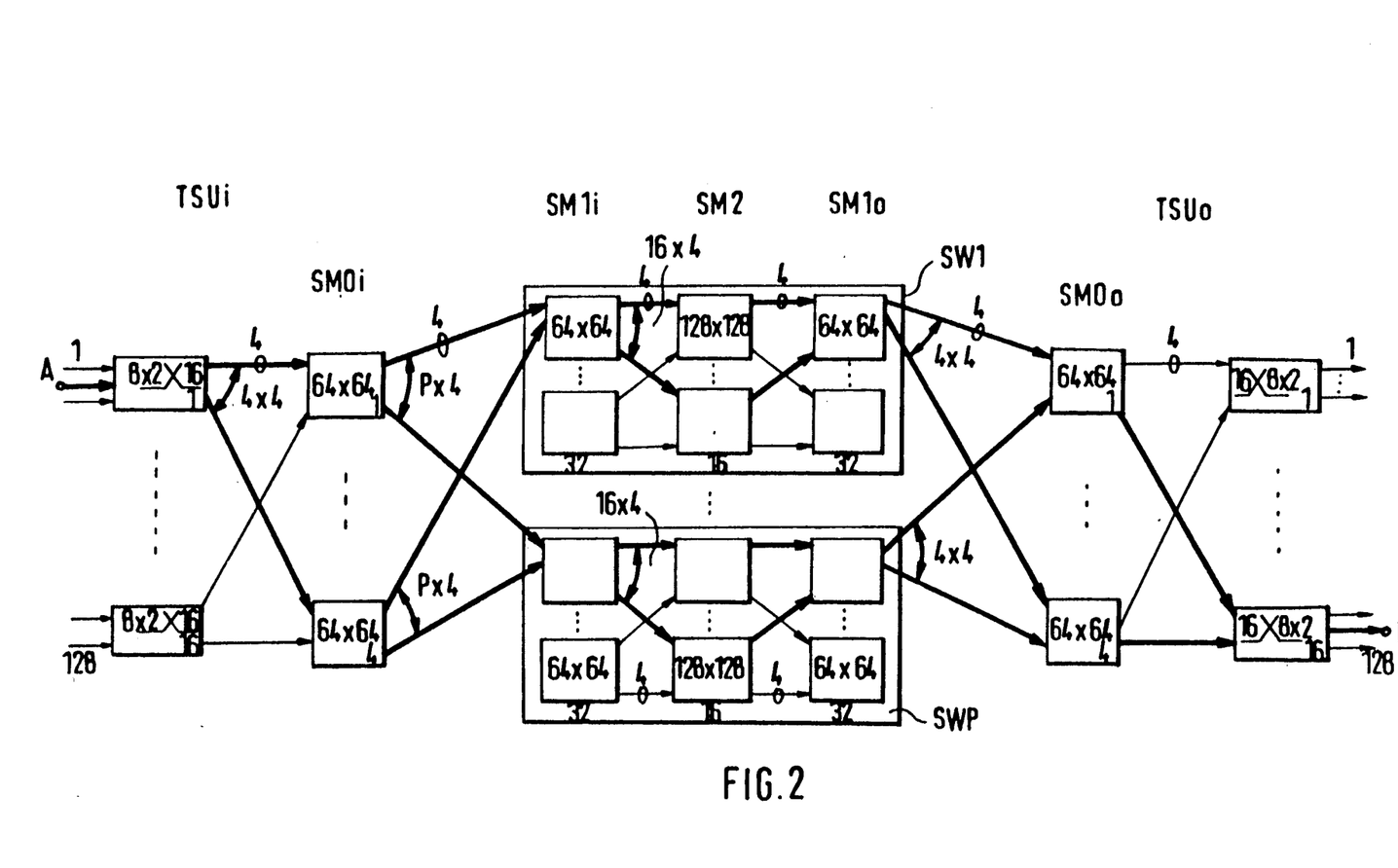
FIG. 2 is another representation of the switching network of FIG. 1 which serves to illustrate the mode of operation.

FIG. 2 shows the same switching network in a straight-forward arrangement. Here, the terminal units TSU and the switching-network modules SM0 contained therein appear as an input portion TSUi and an input portion SM0i, respectively, and as an output portion TSUo and an output portion SM0o, respectively. Similarly, the switching-network modules SM1 appear as an input portion SM1i and an output portion SM1o.

For the rest, FIG. 2 illustrates the conventional structure of a switching network with an odd number of stages, which may also be regarded as a three-stage arrangement, with the middle stage, in turn, consisting of three stages.

Heavy arrows indicate all paths which are possible from an input A to an output B.

In the first half up to the switching-network modules SM2, any output can be taken at any branching point (Muldex, SM0i, SM1i). Only in the second half must the cells be switched selectively to the desired output B. It is readily apparent that the entire switching network is very uniformly loaded at any time if all cells arriving at any input of any terminal unit are freely distributed in the first half of the switching network.

Whether the distribution in the first half is effected cyclically, randomly, or in response to an acknowledgement signal which indicates the load on the succeeding stage is of secondary importance.

Figure 3:
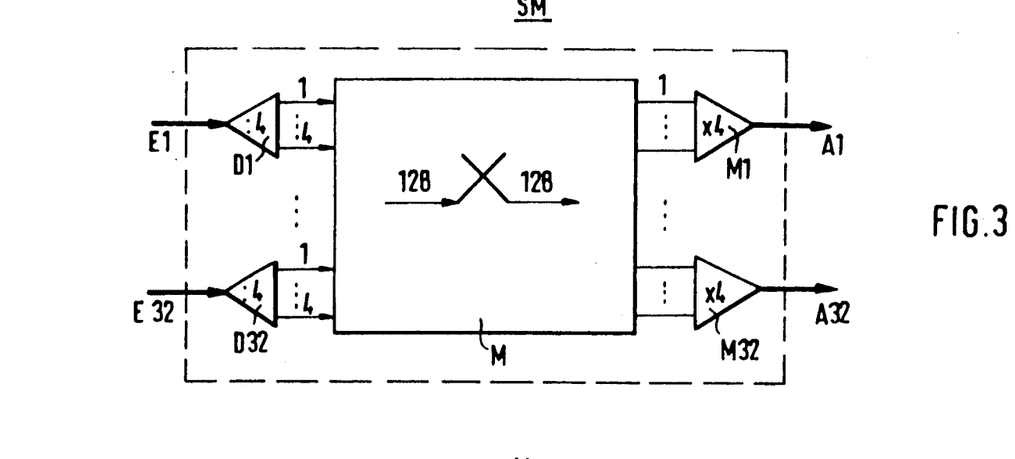
FIG. 3 shows a switching-network module in accordance with the invention.

FIG. 3 shows the coarse structure of a switching-network module SM. The module has 32 input lines E1, . . . , E32 with one demultiplexer D1, . . . , D32 each, 32 output lines A1, . . . , A32 with one multiplexer M1, . . . , M32 each, and a matrix M. Each demultiplexer Dx separates a 600-Mb/s optical data stream into four 150-Mb/s electric data streams. The multiplexers Mx recombine these four electric data streams into one optical data stream.

Figure 4:
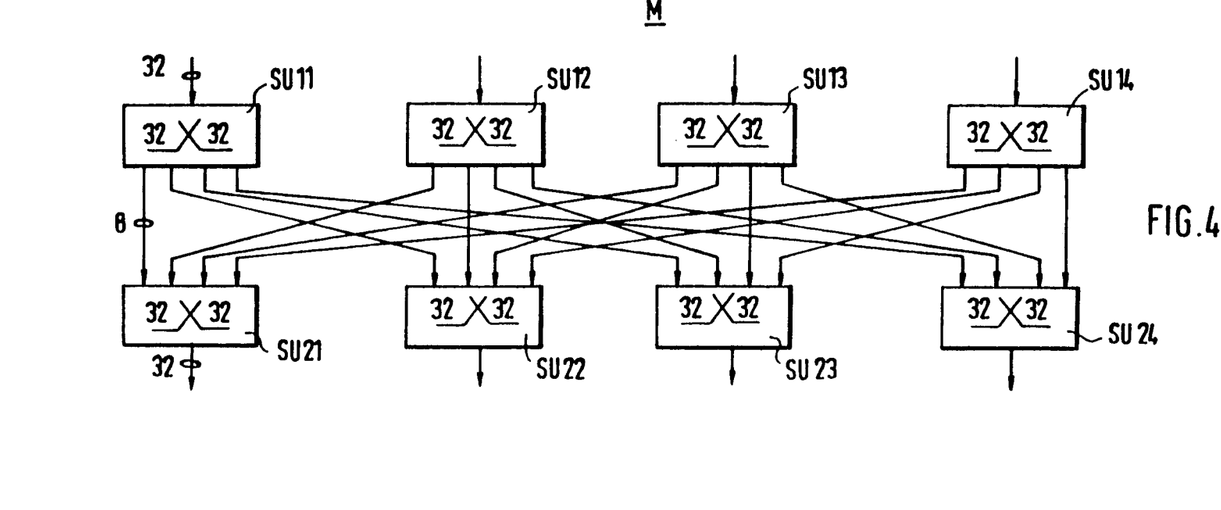
FIG. 4 shows further details of the switching-network module of FIG. 3.

FIG. 4 shows the internal structure of the matrix M. The matrix has eight switching elements which are arranged in two stages SU11 ... SU14 and SU21 ... SU24. Each switching element has 32 150-Mb/s inputs and 32 150-Mb/s outputs. The inputs of the first stage are connected via the demultiplexers to the input lines E1, . . . , E32 of the switching-network module. The outputs of the second stage are connected via the multiplexers to the output lines A1, . . . , A32 of the switching-network module. From each switching element of the first stage, a group of eight lines runs to each switching element of the second stage.

The extreme case to be taken into account in conventional switching arrangements, namely that all inputs of a switching element of the first stage are fully loaded and that the entire traffic must be routed to a single switching element of the last stage for longer than only a very short time, cannot occur here, because no data streams can take the same path for a prolonged period of time. An intermediate stage between the input and output stages can therefore be dispensed with.

A switching element as is needed to implement the switching network according to the invention and the switching-network module according to the invention will now be described with the aid of FIG. 5.

Figure 5:
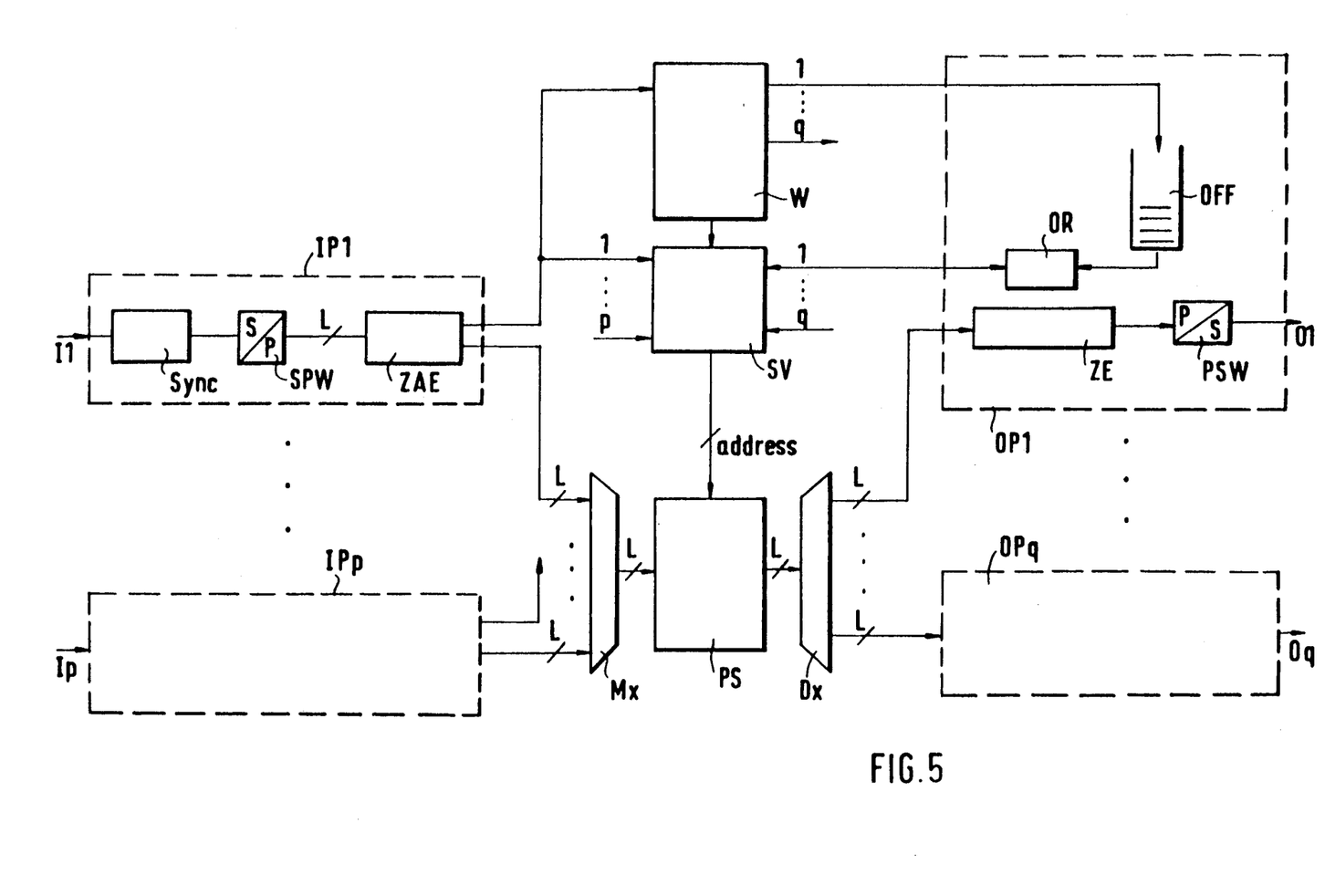
FIG. 5 shows the structure of a switching element.
Figure 6:
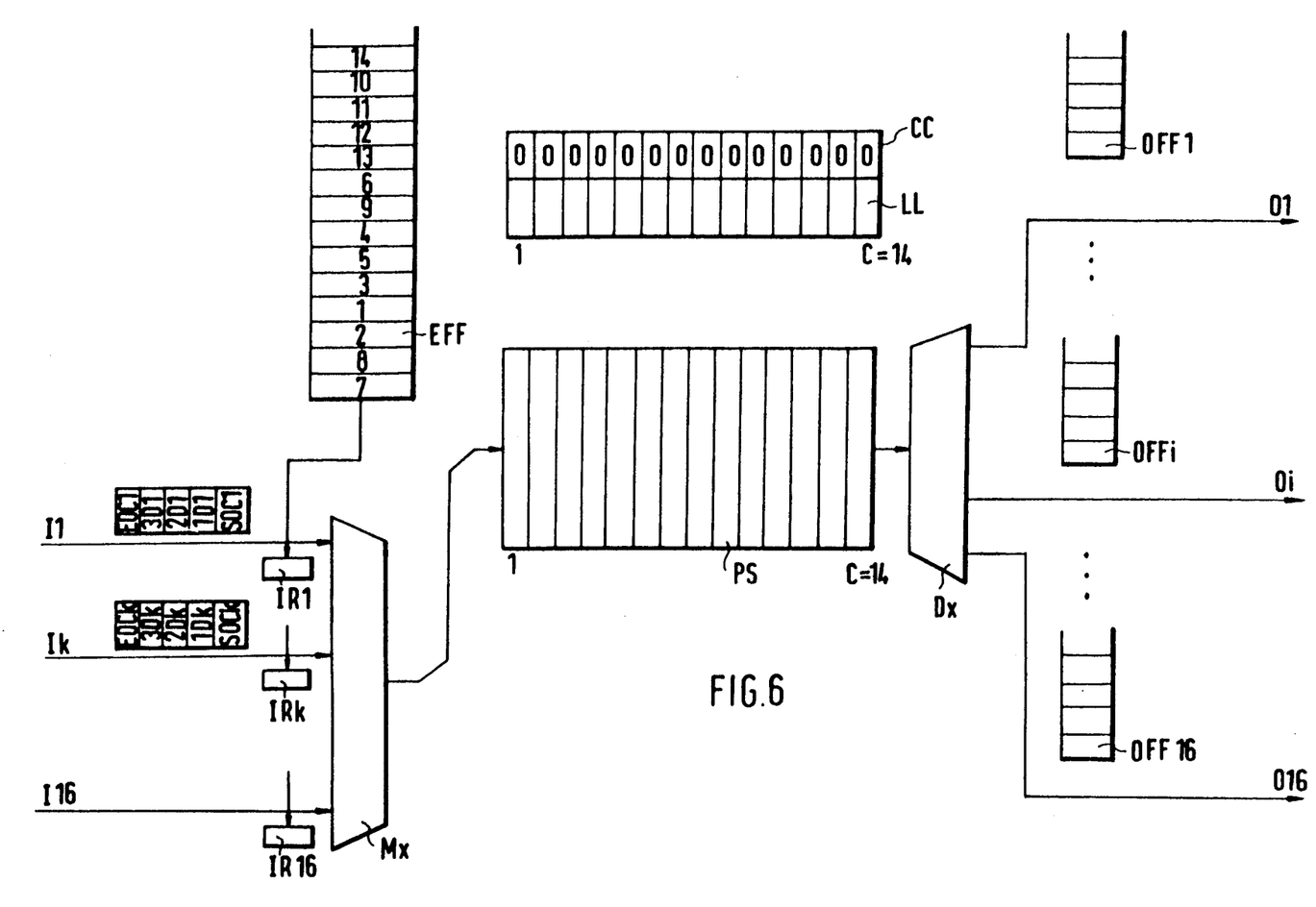
FIGS. 6 to 14 show the way cells are written into and read from the buffer.
Figure 7:
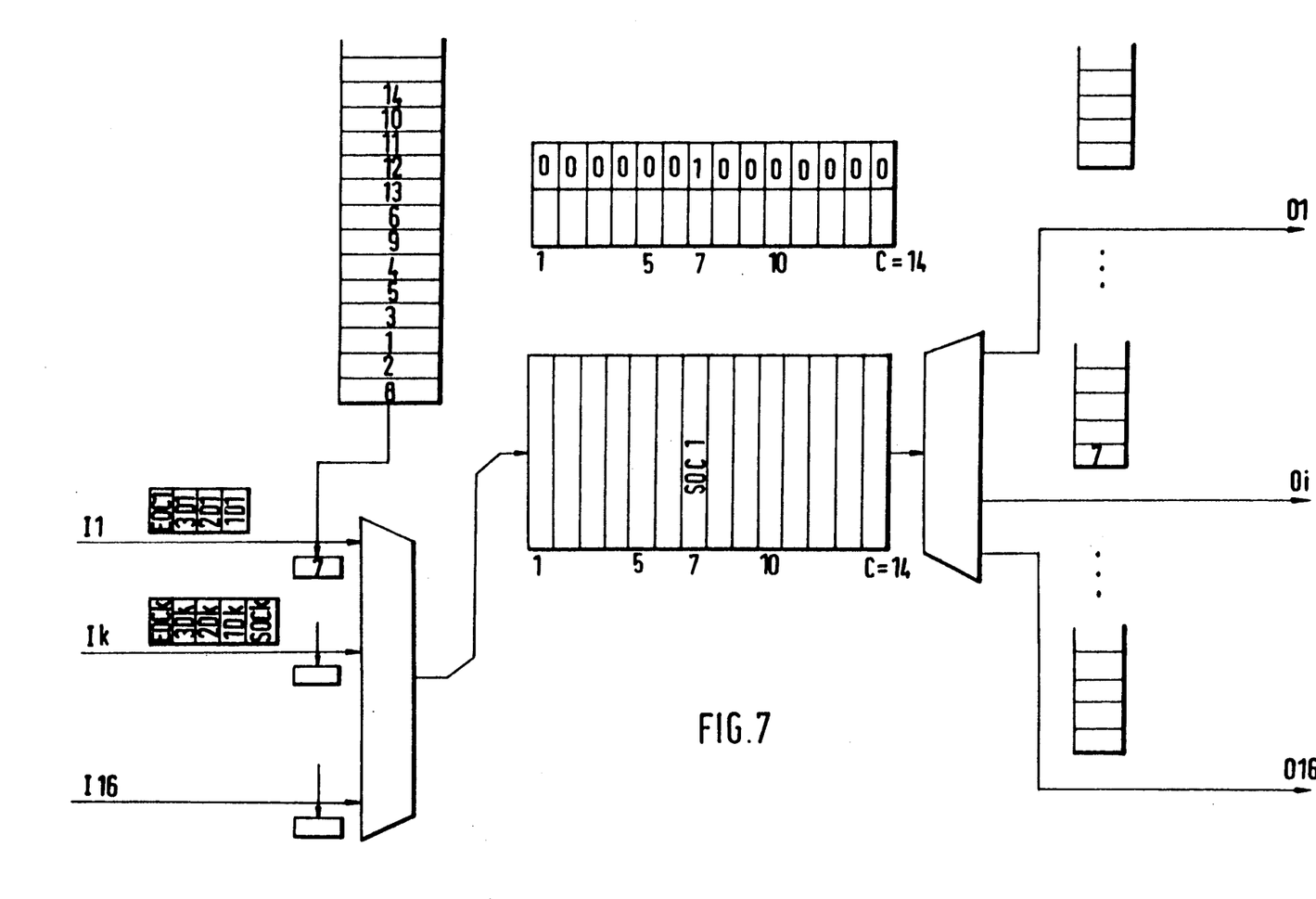

The switching element shown in FIG. 5 has p input units IP1, . . . , IPp with one input line each, I1, . . . , Ip, a multiplexer Mx, a buffer PS with C individually addressable L-bit memory blocks, a demultiplexer Dx, q output units OP1, . . . , OPq, a memory management unit SV, and a routing block W. Preferably, $p = q = 32$, i.e., the switching element has 32 input lines and 32 output lines. For C and L, numerical values of $C = 256$ and $L = 50$ are currently under discussion. The size of the memory blocks cannot be chosen freely. Since, because of the high processing speed, parallel processing will be necessary at least internally, the size of the memory blocks will have to be adapted to the word width created by serial-to-parallel conversion. In the present example, word width and size of a memory block are identical. Memory blocks which can hold four, eight, 16 or more words at a time are also possible. What is appropriate depends on the cell length.

The input unit IP1 shows the internal structure of the input units in some more detail. The input line I1 runs to a synchronizer SYNC, whose output is connected to a serial-to-parallel converter SPW, and the output of the latter is connected via a unit ZAE for detecting starts and ends of cells to the input end of the multiplexer Mx. The unit ZAE is also connected to one input of the routing block W and to one input of the memory management unit SV.

The output unit OP1 shows details of the output units. The output end of the demultiplexer Dx is connected via a unit ZE for detecting ends of cells to a parallel-to-serial converter PSW, whose output is coupled to the output line O1. The output unit further includes an output FIFO OFF and an output register OR. The output FIFO OFF has its input connected to one output of the routing block W, and its output is coupled to the output register OR, which, in turn, is linked bidirectionally with the memory management unit SV.

In FIG. 5, the multiplexer Mx and a network of single lines provide the connection between the input units IP1, . . . , IPp and the central units, namely the buffer PS, the memory management unit SV, and the routing block W. The data stream is converted to an L-bit parallel format. Neither control and clock lines nor the power supply are shown. All this are things for which sufficient solutions are known to the person skilled in the art, i.e., from which he can choose if he knows what information is to be exchanged where and when. In this respect, the same applies as for switch elements for synchronous systems. Such a switch element, which includes a bus system for interconnecting the units, is described in an article by J. M. Cotton et al, "ITT 1240 Digital Exchange Digital Switching Network", *Electrical Communication* Vol. 56, Number 2/3, 1981, pages 148-160. It should be pointed out that a bus system with a plurality of transmitters and one receiver is equivalent to a multiplexer. The same applies analagously to the output side.

The normal switching process will now be described with the aid of a greatly simplified example which is illustrated in FIGS. 6 to 14. In this simple example, the buffer PS has $C = 14$ memory blocks, which are at first all empty. The memory management unit SV is shown by a table-like representation of its memories. The heart of the memory management unit SV is a list memory LL, which has one location for each of the C memory blocks of the buffer PS. This location has the same address as the associated memory block and can receive the address of another memory block. At first (FIG. 6) the list memory LL is empty. The memory management unit SV further includes a memory EFF for storing the addresses of unused memory blocks, which works on the FIFO (first-in-first out) principle and first contains the addresses of all memory blocks of the buffer PS in a random sequence. The output FIFOs, of which OFF1, OFFi, and OFF16 are shown, are at first empty, too. Actually an "empty" location contains some kind of data, as usual. This may be a value which marks it as empty, but it may also be a value from the previous use which is no longer valid. In the latter case, steps must be taken to ensure that this value will not be requested any more. The memory management unit SV of the present embodiment further includes C locations of a count memory CC, which can be addressed by the list memory LL. The count memory CC indicates to how many output units the contents of the associated memory block of the buffer PS still have to be outputted. The contents of all locations of the count memory CC are initially 0.

On each of the input lines I1 and Ik, one cell now arrives. No further cells arrive in this example. The synchronizers of the two input units IP1 and IPk, together with the respective serial-to-parallel converters, convert each of the cells into five blocks of equal length. The first block SOC1, SOCk begins with a start-of-cell label SOC. The last block EOC1, EOCk contains an end-of cell label EOC. The label EOC lies at an arbitrary point within the last block, namely where the cell arriving from outside actually ends. The synchronizer adds blanks to fill the blocks. The remainder of the first blocks, the second to fourth blocks, 1D1, 2D1, 3D1 and 1Dk, 2Dk, 3Dk, respectively, and the portions of the fifth blocks up to the EOC label contain the data of the cells.

The input units are cyclically interrogated by the multiplexer Mx. The units ZAE in the input units IP1 and IPk recognize by the SOC labels that information is present which has to be passed on. From the memory EFF, the address 7 is transferred as the address of an unused memory block into an input register IR1, and the first block SOC1 is stored in the buffer PS in memory block 7. At the same time, the SOC label goes to the routing block W and to the memory management unit SV.

For each switching-network stage to be traversed, the SOC label contains, in the order in which the stages are to be traversed, information on the output to be selected in this stage. After each evaluation, that part of the path information within the SOC label which is valid for the next stage is brought to the correct position by shifting. The path information may be: "Select any output", or "Select any output within a predetermined group of outputs", or "Select a particular predetermined output". Via the path information in the SOC label, the terminal units determine the mode of operation of the switching network.

In the example shown, the output line i is specified. In the output FIFO OFFi, address 7 is noted as the start address of a cell to be outputted by the output unit OPi. In the count memory, a "1" is noted in location 7. This is the condition shown in FIG. 7.

The next block to be transferred into the buffer PS is the block SOCk from the input IPk. The memory EFF indicates that this block is to be stored in the buffer in memory block 8. The routing block W determines from the SOC label that this cell is to be outputted to both the output line O1 and the output line Oi. This multiple-output capability is a special feature of the switching element described here. It has nothing to do with the structures of the switching network and the switching-network module in accordance with the invention. Address 8 is therefore stored both in the output FIFO OFF1 and in the output FIFO OFFi, in the latter in the second location behind the 7. The block SOCk itself is stored in the buffer PS in memory block 8, and in the count memory CC, "2" is entered into location 8. The "8" is stored in the input register IRk. This is the condition shown in FIG. 8.

Figure 8:
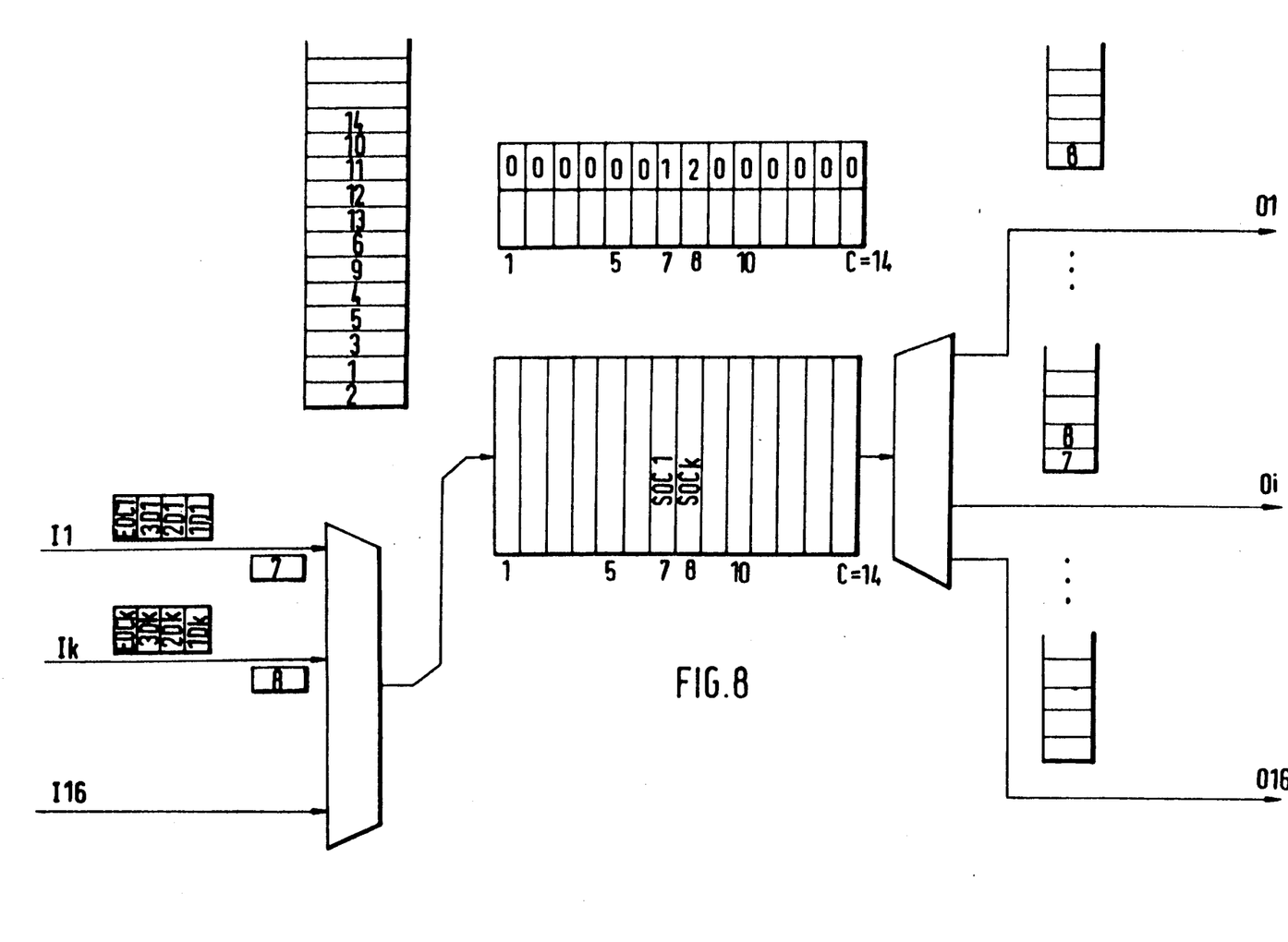

Next, the block 1D1 is stored in the buffer PS in the next unused memory block (memory block 2); in the count memory CC, a "1" is entered into location 2, and in the list memory, a "2" is entered into location 7. Address 7 was temporarily stored in IR1 as the address under which the preceding block of this cell was stored. In the same manner, the other blocks from the input units IP1 and IPk are stored.

Figure 9:
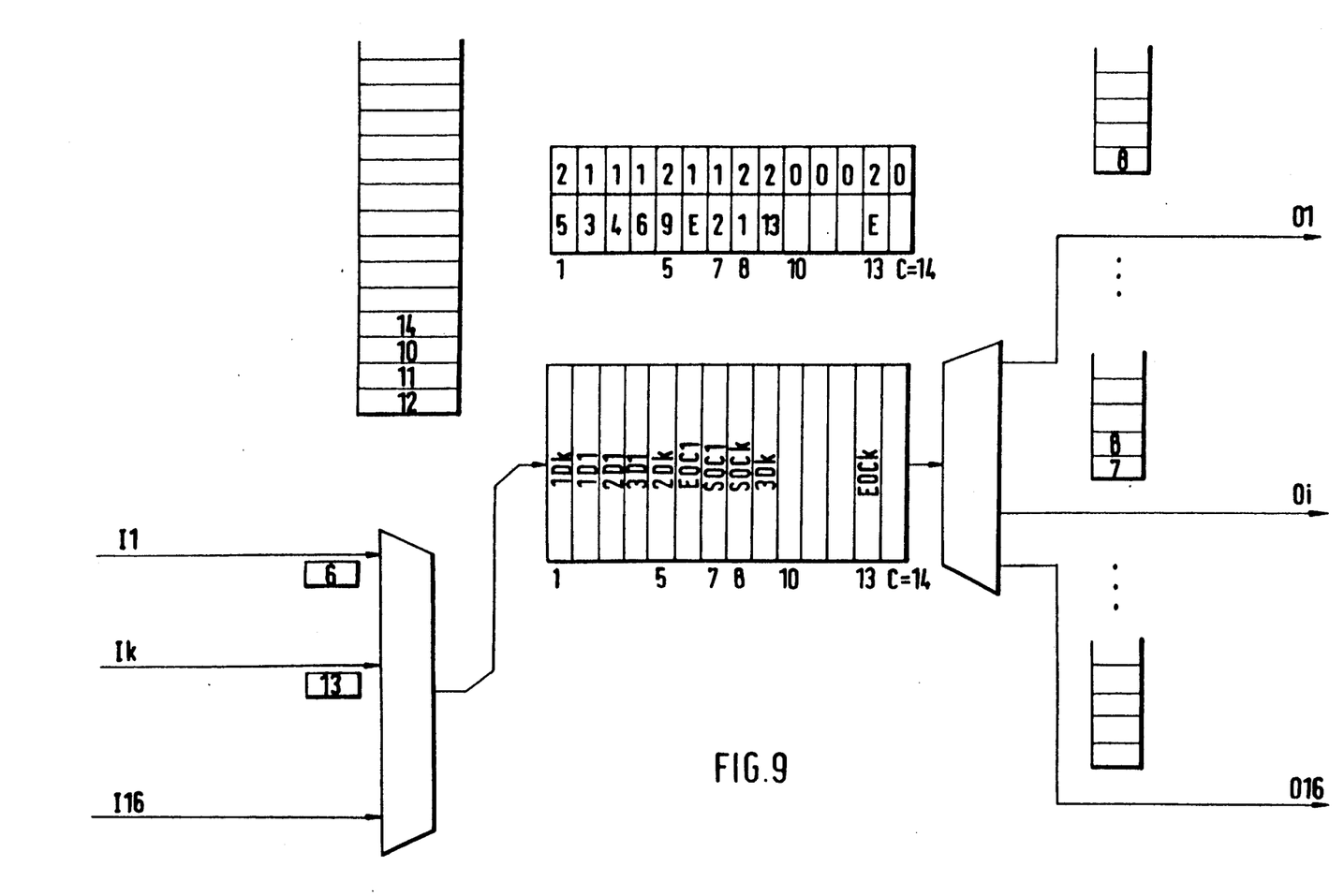
Figure 10:
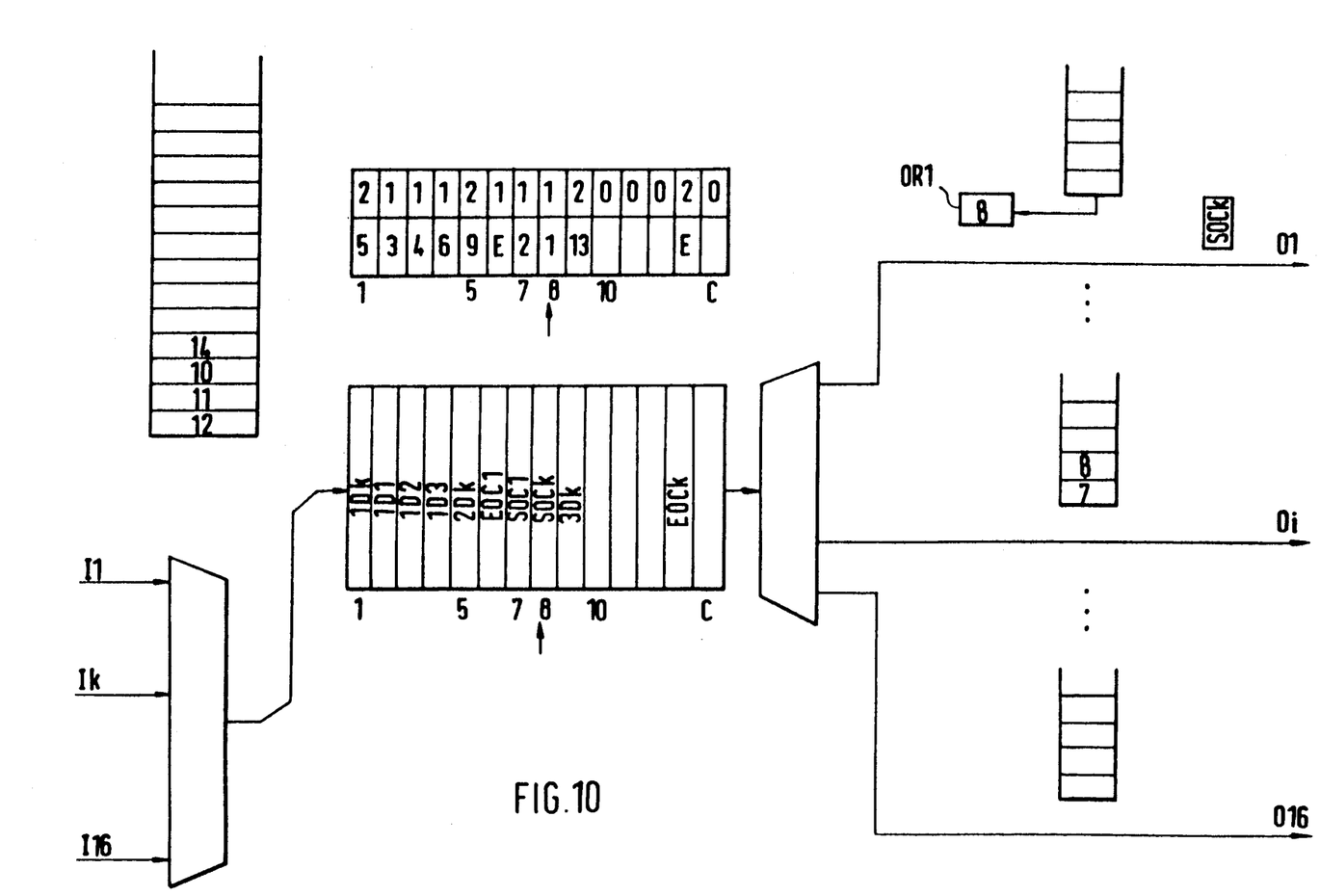

At the end of the input, shown in FIG. 9, the blocks of the cell received from I1 are stored in the memory blocks 7, 2, 3, 4, and 6 in this order, and the blocks of the cell received from Ik are stored in the memory blocks 8, 1, 5, 9, and 13 in this order. The memory EFF indicates only four unused memory blocks in the buffer PS. The list memory LL contains the above-mentioned address sequences, with a special character, here "E", entered instead of a link address for the respective last block.

The output of the cells, which is to follow the complete input, will now be described with the aid of FIGS. 10 to 14. Output is initiated from the output units; to this end, the output units are cyclically activated.

The output FIFO OFF1 indicates that a cell whose first block is stored in the buffer in memory block 8 is to be outputted via the output line O1. Address 8 is transferred to the output register OR1 and applied to buffer PS, list memory LL, and count memory CC; the first block is outputted from PS, the link address "1" is transferred from LL to OR1, and the count memory is decremented from "2" to "1", cf. FIG. 10.

Figure 11:
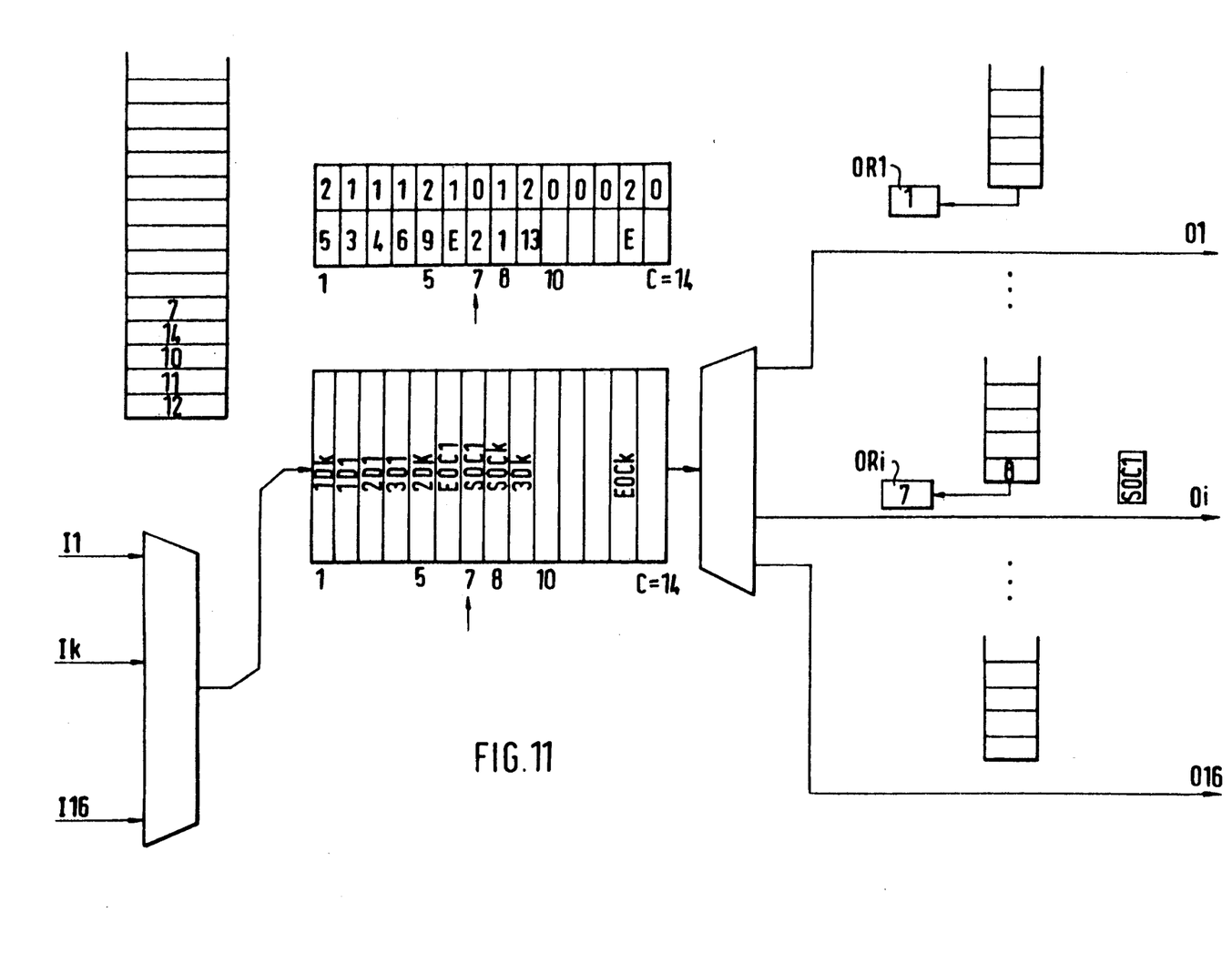

FIG. 11 shows the next output, which is initiated from OPi. The start address 7 is transferred from OFFi to ORi and applied to PS, LL, and CC; the first block is outputted from PS, the link address 2 is transferred to ORi, and CC is decremented from "1" to "0". This "0" indicates that the contents of block 7 in PS are no longer needed; this block is now free, and its address is returned to the memory EFF for storing the addresses of unused memory blocks.

Figure 12:
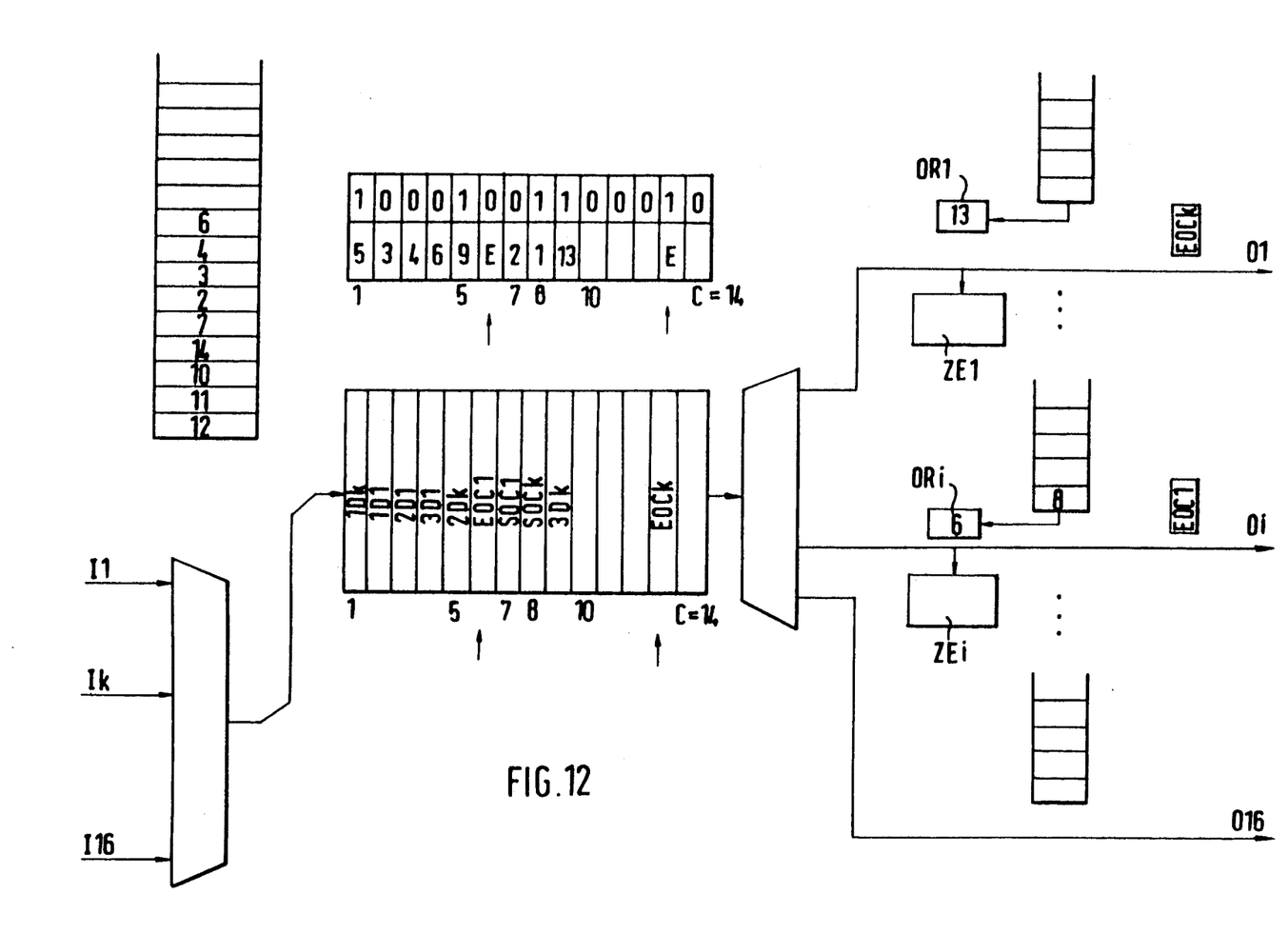
Figure 13:
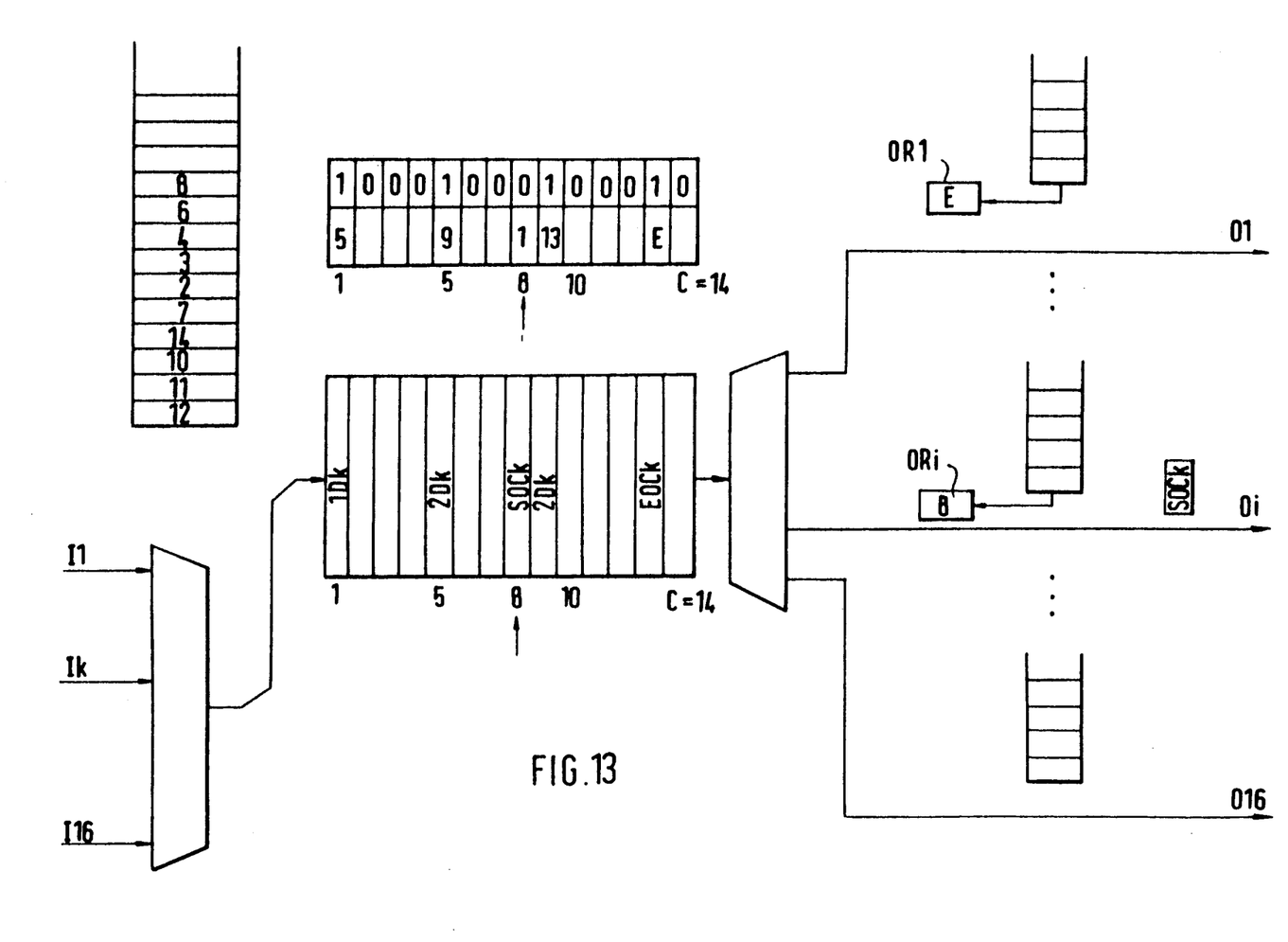

FIG. 12 shows the condition which results when one cell has been outputted to O1 and Oi each. The end of a cell is detected both by the units ZE1 and ZEi for detecting ends of cells and with the aid of the contents of the output registers OR1 and ORi. Units not shown cause dummy blocks to be transmitted. OFFi indicates, however, that a further cell has to be transmitted from the output unit OPi, and that the first block of this cell is stored in PS in memory block 8. The output of the cell begins with the condition in FIG. 13 and ends with the condition in FIG. 14.

Figure 14:
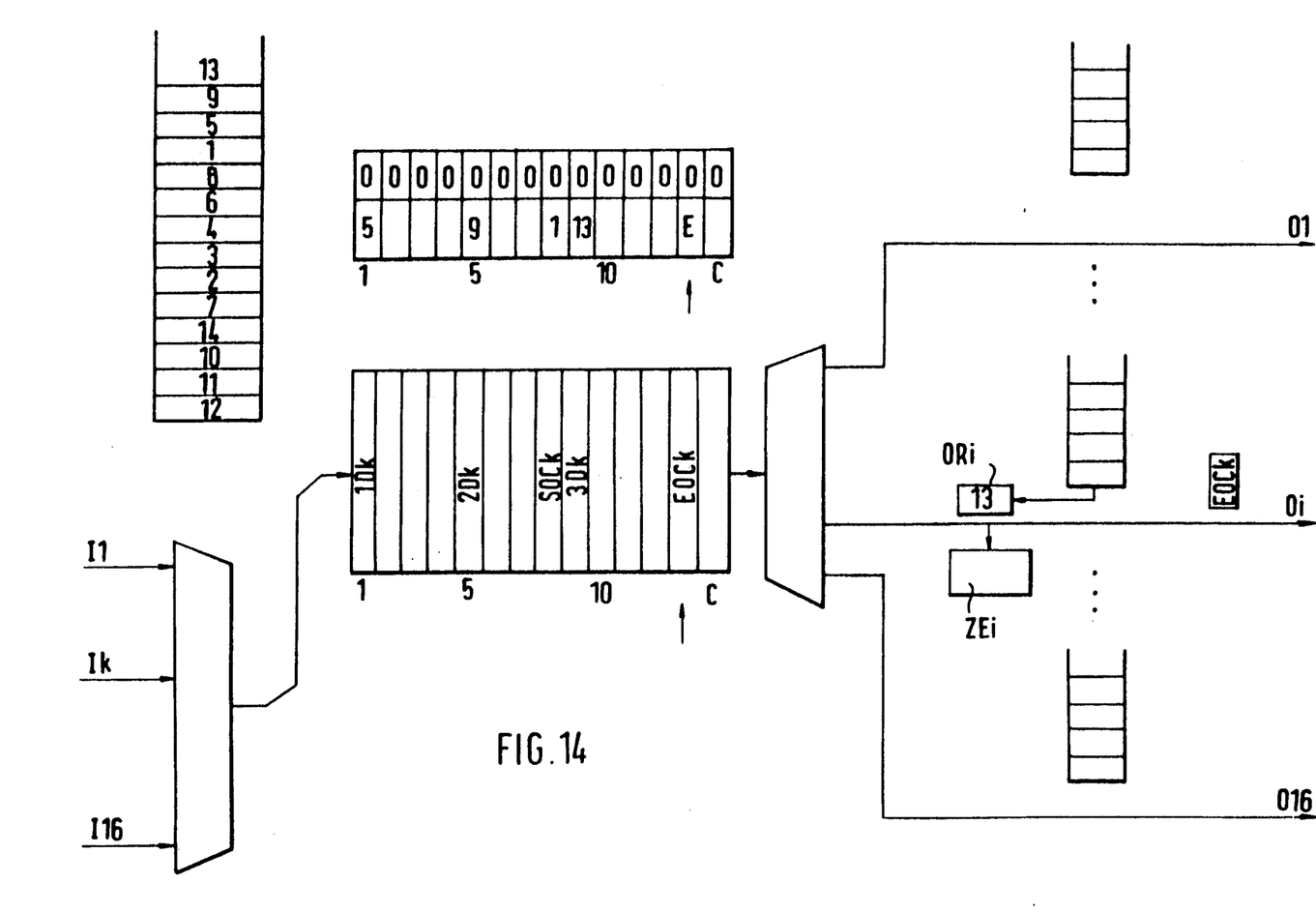

All blocks have thus been outputted, buffer PS and list memory LL are free, all locations of the count memory CC contain a "0", the memory EFF again contains the addresses of all memory blocks of PS, even though in a different order, and dummy blocks are being transmitted over all output lines.

In reality, inputs and outputs need not necessaryily be separated in time as described but may occur simultaneously. The buffer PS is designed as a dual-port RAM, so that inputs and outputs can access it independently of each other. This means in particular that the first blocks of a cell can be read out before the last blocks have been written in. This minimizes the delay of the cells and the holding time of the buffer PS.

I claim:

1. Switching network for information transmitted synchronously as sequences of cells, said network comprising a plurality of interchangeable switching modules each further comprising a multi-stage switching arrangement including at least two first stage switching elements and at least two last stage switching elements, wherein each switching element further comprises two or more element inputs for receiving individual ones of said cells, two or more element outputs for transmitting said individual cells, means for transferring a cell received at any said element input of said each switching element to any said element output of said each switching element, and a common memory for buffering a cell so received at said any element input until it is so transferred to said any element output, each said element input of each first stage switching-element is connected to a respective module input of the element's associated switching module, each said element output of each last stage switching element is connected to a respective module output of the element's associated switching module, during the passage of each cell through successive stages of the switching network, the element outputs to which said each cell is initially successively transferred as the cell traverses a first portion of the switching network are selected independently of a predetermined destination of said each cell, and the element outputs to which the cell is finally successively transferred as the cell traverses a last portion of the switching network are selected in accordance with said predetermined destination, at least one path is possible from any module input of said each switching module to any module output of said each switching-network module, and if the number of said successive stages of said multi-stage switching arrangement were to be reduced for said each switching-network module, no path would be possible through said multi-stage switching arrangement from at least one module input of switching-network module to at least one module output of the same switching-network module.

2. A switching network as claimed in claim 1, wherein said multi-stage arrangement consists only of said first stage switching elements and said last stage switching elements, and every said first stage switching element of said each module is directly connected to every last stage switching element of said each module.

3. A switching network as claimed in claim 2, wherein groups of two or more element outputs of each said first stage switching element of a switching-network module are directly connected to respective groups of two or more element inputs of a last stage switching element of the switching-network module.

4. Switching module for asynchronous transmission mode cells, said module comprising a plurality of module inputs selectively connected to a plurality of module outputs by means of a multi-stage switching arrangement further comprising a plurality of successive stages of switching elements including a first stage having at least four first stage switching elements and a last stage having at least four last stage switching elements, wherein each said switching element further comprises four or more element inputs for receiving cells, four or more element outputs for transmitting cells, means for transferring a cell received at any said element input to any said element output, and a common memory for buffering at least four cells after they are received at one or more of said element inputs and before they are transmitted from one or more of said element outputs, each element input of each said first stage is connected to a different corresponding module input, each element output of each said last stage is connected to a different corresponding module output, between any two successive said stages, the element outputs of the preceding stage are connected to the element inputs of the succeeding stage such that at least one path is possible from every module input to every module output, and if the number of said stages is reduced, for at least one pair of said module inputs and said module outputs no such path is possible.

5. A switching network module as claimed in claim 4, wherein said module is a two-stage arrangement of said switching elements, and every switching element of the first stage is directly connected to every switching element of the second stage.

6. A switching-network module as claimed in claim 5, wherein groups of two or more element outputs of a switching element of a preceding stage are directly connected to groups of two or more element inputs of a switching element of a succeeding stage.

* * * * *